US012148612B2

(12) United States Patent
Xie et al.

(10) Patent No.: US 12,148,612 B2
(45) Date of Patent: Nov. 19, 2024

(54) NON-POLAR III-NITRIDE BINARY AND TERNARY MATERIALS, METHOD FOR OBTAINING THEREOF AND USES

(71) Applicants: Fengjie Xie, Shanghai (CN); Mengyao Xie, Madrid (ES)

(72) Inventors: Mengyao Xie, Madrid (ES); Amalia Luisa Fernando Saavedra, Madrid (ES); Ana María Bengoechea Encabo, Madrid (ES); Steven Albert, Madrid (ES); Enrique Calleja Pardo, Madrid (ES); Miguel Angel Sánchez García, Madrid (ES); David López-Romero Moraleda, Madrid (ES)

(73) Assignees: Fengjie Xie, Shanghai (CN); Mengyao Xie, Madrid (ES)

( * ) Notice: Subject to any disclaimer, the term of this patent is extended or adjusted under 35 U.S.C. 154(b) by 401 days.

(21) Appl. No.: 17/728,902

(22) Filed: Apr. 25, 2022

(65) Prior Publication Data
US 2022/0254625 A1 Aug. 11, 2022

Related U.S. Application Data

(63) Continuation of application No. PCT/EP2020/079359, filed on Oct. 19, 2020.

(51) Int. Cl.
*H01L 21/02* (2006.01)
*C30B 29/40* (2006.01)
(Continued)

(52) U.S. Cl.
CPC ........ *H01L 21/0254* (2013.01); *C30B 29/406* (2013.01); *H01L 21/02609* (2013.01);
(Continued)

(58) Field of Classification Search
CPC ..... C30B 25/04; C30B 25/186; C30B 29/403; C30B 29/406; H01L 21/0254;
(Continued)

(56) References Cited

U.S. PATENT DOCUMENTS

| 7,338,828 B2 | 3/2008 | Imer et al. |
| 7,955,983 B2 | 6/2011 | Imer et al. |

(Continued)

FOREIGN PATENT DOCUMENTS

| CN | 101542024 A | 9/2009 |
| CN | 102719887 A | 10/2012 |

(Continued)

OTHER PUBLICATIONS

English computer translation of WO-2018076407-A1 (Year: 2024).*
(Continued)

*Primary Examiner* — Matthew J Song

(57) ABSTRACT

The disclosure is aimed at a method for obtaining non-polar III-Nitride compact layers by coalescence of an ordered-array of etched non-polar 111-Nitride nanopillars. Besides, the disclosure also relates to the non-polar III-Nitride binary and ternary compact, continuous (2D) films, layers, or pseudo-substrates, obtainable by means of the disclosed method and having advantageous properties. The disclosure also includes a specific group of non-polar III-Nitride compact, continuous (2D) films or layers, having one of the components selected from the group consisting of In, Al and both elements, enfolding ordered arrays of non-polar III-Nitride nano-crystals, regardless the method for obtaining thereof, said film or layer being one of the groups consisting of: non-polar InN, non-polar AlN, non-polar $Ga_xAl_{1-x}N$, non-polar $In_xAl_{1-x}N$ and non-polar $GaxIn_{1-x}N$, where $0<x<1$.

18 Claims, 4 Drawing Sheets

(51) Int. Cl.
*H01L 33/00* (2010.01)
*H01S 5/32* (2006.01)
*H01S 5/02* (2006.01)

(52) U.S. Cl.
CPC ...... *H01L 33/0075* (2013.01); *H01S 5/32025* (2019.08); *H01S 5/0206* (2013.01)

(58) Field of Classification Search
CPC ........... H01L 21/02609; H01L 33/0075; H01S 5/0206; H01S 5/32025
See application file for complete search history.

(56) References Cited

U.S. PATENT DOCUMENTS

| | | |
|---|---|---|
| 8,148,244 B2 | 4/2012 | Baker et al. |
| 8,338,273 B2 | 12/2012 | Khan et al. |
| 8,652,947 B2 | 2/2014 | Wang |
| 9,034,739 B2 | 5/2015 | Wang |
| 2009/0079035 A1 | 3/2009 | Wang |
| 2012/0241755 A1 | 9/2012 | Romanov et al. |
| 2014/0131730 A1 | 5/2014 | Keller et al. |

FOREIGN PATENT DOCUMENTS

| | | | |
|---|---|---|---|
| CN | 103548154 A | 1/2014 | |
| GB | 2488587 A | 9/2012 | |
| GB | 2488587 B | 7/2015 | |
| JP | 2006315947 A | 11/2006 | |
| JP | 2015166293 A | 9/2015 | |
| TW | 200924029 A | 6/2009 | |
| WO | 2013021606 A1 | 2/2013 | |
| WO | 2016178024 A1 | 11/2016 | |
| WO | WO-2018076407 A1 * | 5/2018 | ........... H01L 33/007 |

OTHER PUBLICATIONS

A Bengoechea-Encabo et al., "Selective area growth of AlN/GaN nanocolumns on (0001) and (11-22) GaN/sapphire for semi-polar and non-polar AlN pseudo-templates", Nanotechnology 28 (2017) 365704 (6pp), Sep. 8, 2017.
International Search Report of PCT/EP2020/079359 (Feb. 10, 2021).
Bengoechea-Encabo A et al: "Selective area growth of AlN/GaN nanocolumns on (0001) and (11-22) GaN/sapphire for semi-polar and non-polar AlN pseudo-templates", Nanotechnology, Institute of Physics Publishing, GB, vol. 28, No. 36, Aug. 16, 2017, p. 365704.
Bross Adam S et al: "Nanopatterned epitaxy of non-polar Ga1-yInyN layers with caps and voids", Journal of Applied Physics, American Institute of Physics, US, vol. 122, No. 9, Sep. 5, 2017.
B. A. Haskell et al., "Defect reduction in (1120) a-plane gallium nitride via lateral epitaxial overgrowth by hydride vapor-phase epitaxy", Applied Physics Letters 83, 644 (2003); doi: 10.1063/1.1593817, Jul. 28, 2003.
Shih-Chun Ling et al., "Nanorod epitaxial lateral overgrowth of -plane GaN with low dislocation density", Appl. Phys. Lett. 94, 251912 (2009); doi: 10.1063/1.3158954, Jun. 26, 2019.
Michele Conroy et al., "Epitaxial lateral overgrowth of AlN on self-assembled patterned nanorods", J. Mater, Chem. C, 2015, 3, 431-437.
Qiming Li et al., "Nanowire-Templated Lateral Epitaxial Growth of Low-Dislocation Density Nonpolar a-Plane GaN on r-Plane Sapphire", Adv. Mater. 2009, 21, 2416-2420.
S. Albert et al., "Selective area growth of GaN nanostructures: A key to produce high quality (11-20) aplane pseudo-substrates", Appl. Phys. Lett. 105, 091902 (2014); Sep. 3, 2014.
Rafael Dalmau et al., "AlN Bulk Crystal Growth by Physical Vapor Transport", DOI: 10.1007/978-3-540-74761-1_24, Jan. 2010.
L. Jiu et al., "Overgrowth and strain investigation of (11-20) non-polar GaN on patterned templates on sapphire", Scientific Reports, (2018) 8:9898, DOI:10.1038/s41598-018-28328-7, Jul. 2, 2018.

P. Frajtag et al., "Embedded voids approach for low defect density in epitaxial GaN films", Appl. Phys. Lett. 98, 023115 2011, Jan. 14, 2011.
Sten Heikman et al., "Epitaxial Lateral Overgrowth of High Al Composition AlGaN Alloys on Deep Grooved SiC Substrates", 2005 Jpn. J. Appl. Phys. 44 L405, Mar. 11, 2005.
Masataka Imura et al., "Epitaxial lateral overgrowth of AlN on trench-patterened AlN layers", Journal of Crystal Growth, 298 (2007) 257-260, Nov. 20, 2006.
Z. Chen et al., "Pulsed lateral epitaxial overgrowth of aluminum nitride on sapphire substrates", Appl. Phys. Lett. 89, 081905 (2006), Aug. 21, 2006.
K. Nakano et al., "Epitaxial lateral overgrowth of AlN layers on patterned sapphire substrates", phys. stat. sol. (a) 203, No. 7, 1632-1635 (2006), May 22, 2006.
Bei Ma et al., "Facet control in selective area growth (SAG) of a-plane GaN by MOVPE", Mater. Res. Soc. Symp. Proc. vol. 1202, Jan. 31, 2011.
P. Aseev et al., "Improving optical performance of GaN nanowires grown by selective area growth homoepitaxy: Influence of substrate and nanowire dimensions", Appl. Phys. Lett. 108, 253109 (2016), Jun. 22, 2016.
Chaowang Liu et al., "GaN nano-pendeo-epitaxy on Si(111) substrates", Phys. Status Solidi C 6, No. S2, S527-S530 (2009), Jan. 15, 2009.
Wang Nang Wang et al., "Nano-pendeo GaN Growth of Light Emitting Devices on Silicon", J. Light & Vis. Env. vol. 32, No. 2, 2008, Jan. 2018.
M.-Y. Xie et al., "Elastic constants, composition, and piezolectric polarization in InxAl1-xN: From ab initio calculations to experimental implications for the applicability of Vegard's rule", Physical Review B 86, 155310 (2012), Oct. 12, 2012.
Yasuhiro Hashimoto et al., "Growth of semipolar {20-21} GaN and {20-2-1} GaN for GaN substrate", Phys. Status Solidi B 253, No. 1, 36-45 (2016), Aug. 20, 2015.
F Scholz, "Semipolar GaN grown on foreign substrates: a review", Semicond. Sci. Technol. 27 (2012) 024002 (15pp), Jan. 19, 2012.
Congbiao Jiang et al., "Fully Solution-Processed Tandem White Quantum-Dot Light-Emitting Diode with an External Quantum Efficiency Exceeding 25%", ACS Nano 2018, 12, 6040-6049, Jun. 12, 2018.
Y. Sayad, "Photovoltaic potential of III-nitride based tandem solar cells", Journal of Science: Advanced Materials and Devices 1 (2016) 379-381, Aug. 9, 2016.
Selective area growth of GaN nanostructures: A key to produce high quality (11-20) a-plane pseudo-substrates; S. Albert, A. Bengoechea-Encabo, J. Zuniga-Perez, P. de Mierry, P. Val, M. A. Sanchez-Garcia and E. Calleja, Applied Physics Letters, 2014, 105, 091902.
Selective area growth of a- and c-plane GaN nanocolumns by molecular beam epitaxy using colloidal nanolithography; A. Bengoechea-Encabo, S. Albert, M. A. Sanchez-Garcia, L. L. López, S. Estradé, J. M. Rebled, F. Peiró, G. Nataf, P. de Mierry, J. Zuniga-Perez, E. Calleja, Journal of Crystal Growth, 2012, 353, 1-4.
Selective area growth of AlN/GaN nanocolumns on (0001) and (11-22) GaN/ sapphire for semi-polar and non-polar AlN pseudo-templates. A. Bengoechea-Encabo, S. Albert, M. Müller, M.-Y. Xie, P. Veit, F. Bertram, M. A. Sanchez-Garcia, J. Zuniga-Perez, P. de Mierry, J. Christen and E. Calleja, Nanotechnology, 2017, 28(36), 365704.
Selective area growth of III-nitride nanorods on polar, semi-polar, and non-polar orientations: device applications.. S. Albert, A. Bengoechea-Encabo, D. Lopez-Romero, P. de Mierry, J. Zuñiga-Perez, X. Kong, A. Trampert, M. A. Sanchez-García and E. Calleja, SPIE.Photonics West—Exhibition & Conference 9370, Feb. 2015 & Session 10—Keynote session and Keynote Paper: Proc. SPIE 9370, Quantum Sensing and Nanophotonic Devices XII, 937017.
"Selective Area Growth of III-Nitrides on polar and semi-polar orientations: from light emitters to pseudo-substrates" E. Calleja, A. Bengoechea-Encabo, S. Albert, M.A. Sanchez-Garcia, D. Lopez-Romero, A. Trampert, U. Jahn, F. Bertram and J. Christen, 2014 IEEE Photonics Society Summer Topical Meeting Series, Montreal, QC, Canada, 2014, 34-34.

(56) References Cited

OTHER PUBLICATIONS

Advances in MBE Selective Area Growth of III-Nitride Nanostructures: From NanoLEDs to Pseudo Substrates. S. Albert, A. M. Bengoechea-Encabo, F. Barbagini, D. Lopez-Rormero, M. A. Sanchez-Garcia, E. Calleja, P. Lefebvre, X. Kong, U. Jahn, A. Trampert, M. Müller, F. Bertram, G. Schmidt, P. Veit, S. Petzold, J. Christen, P. de Mierry and J. Zuñiga-Perez, International Journal of High Speed Electronics and Systems, 2014, 23(3 & 4), 1450020.

Ordered arrays of defect-free GaN nanocolumns with very narrow excitonic emission line width. A. Fernando-Saavedra, S. Albert, A. Bengoechea-Encabo, D. Lopez-Romero, M. Niehle, S. Metzner, G. Schmidt, F. Bertram, M. A. Sánchez-García, A. Trampert, J. Christen, and E. Calleja, Journal of Crystal Growth, 2019, 525, 125189.

Selective area growth and characterization of InGaN nanocolumns for phosphor-free white light emission. S. Albert, A. Bengoechea-Encabo, M. A. Sanchez-Garcia, E. Calleja, and U. Jahn, J. Appl. Phys. 2013, 113, 114306.

Correlation among Growth Conditions, Morphology, and Optical Properties of Nanocolumnar InGaN/GaN Heterostructures Selectively Grown by Molecular Beam Epitaxy. S. Albert, A. Bengoechea-Encabo, X. Kong, M. A. Sanchez-Garcia, A. Trampert and E. Calleja, Cryst. Growth Des. 2015, 15, 6, 2661-2666.

E-beam nano-patterning for the ordered growth of GaN/InGaN nanorods. F. Barbagini, A. Bengoechea-Encabo, S. Albert, P. Lefebvre, J. Martinez, M. A. Sanchez-Garcia, A. Trampert and E. Calleja, Microelectronic Engineering, 2012, 98, 374-377.

* cited by examiner

NON-POLAR III-NITRIDE BINARY AND TERNARY MATERIALS, METHOD FOR OBTAINING THEREOF AND USES

RELATED APPLICATIONS

This application is a continuation application of PCT application No. PCT/EP2020/079359, filed on Oct. 19, 2020, which claimed the benefit of priority of EP patent application No. 19382929.8, filed on Oct. 25, 2019, and the contents of which are incorporated herein by reference in their entireties.

TECHNICAL FIELD

The disclosure relates to semiconductor materials, as well as the corresponding fabrication methods, and particularly to the coalescence of ordered arrays of nano-crystals for strain and defect reduction in the resulting 2D layer.

BACKGROUND

The term of III-Nitride may include ternary alloys $Ga_xAl_{1-x}N$, $In_xAl_{1-x}N$ and $Ga_xIn_{1-x}N$ (0<x<1), as well as the binaries, GaN, AlN and InN. They are semiconductor materials very promising for the fabrication of high-power/frequency electronic devices and high-efficiency optoelectronic devices. Currently, III-Nitrides light emitting diodes (LEDs) and laser diodes (LDs), covering the medium-near ultraviolet range and most of the visible spectrum, are commercially available.

The stable structure of III-Nitrides is the hexagonal wurtzite. Most of the III-Nitrides based devices are grown along the polar c-plane orientation ((a) in FIG. 1) that induces a strong internal electric field by polarization effects, being detrimental to the performance of optoelectronic devices. As an example, this effect is one of the most relevant obstacles to achieve high-performance green LEDs and LDs using c-plane InGaN/GaN Quantum Wells (QWs). Changing the polarization of the III-Nitride based devices may be a solution. The m-plane ((b) in FIG. 1) and the a-plane ((c) in FIG. 1) of the wurtzite structure are non-polar planes.

Limited by the growth technique, only two binary non-polar bulk substrates are available in the market: GaN and AlN. However, the state-of-the-art of non-polar AlN and GaN substrates cut from bulk materials is still far from maturity, being extremely expensive and having non-standard sizes (smaller than a 50.8 mm-2"-standard wafer). Moreover, due the actual growth technique of physical vapor transport (PVT), bulk AlN contains an extremely high density of impurities and intrinsic defects, such as C, O and N vacancies. So that the crystals present a visible brown color instead of the achromatic transparency typical of AlN films grown by molecular beam epitaxy (MBE), or metal-organic vapor phase epitaxy (MOVPE). The huge amount of point defects, not only changes the optical properties of the AlN crystal, but also influences the lattice structure and growth kinetics of the bulk AlN as a substrate. Besides, due to the segregation of the impurities from the bulk AlN, the subsequent growth of any layer on top may get contaminated.

Foreign substrates may also show non-polar orientations allowing the growth of layers and devices on them, having rather large and standard sizes at a low cost. However, growing III-Nitrides on a foreign substrate, no matter whether along a polar or non-polar direction, generates a high threading dislocation (TDs) density and Stacking Faults (SFs) within the film. For example, the TDs density in an a-plane GaN layer on sapphire may be 100 to 10000 times higher than the limit values required for commercial LED and LD fabrication, respectively (M. S. Shur and A. Zukauskas (2004), *UV Solid-State Light Emitters and Detectors*. Springer Netherlands; B. A. Haskell, F. Wu, M. D. Craven, S. Matsuda, P. T. Fini, T. Fujii, K. Fujito, S. P. DenBaars, J. S. Speck, and S. Nakamura (2003), *Applied Physics Letters* 83 (4), 644).

Therefore, growing non-polar III-Nitride pseudo-substrates with arbitrary composition on foreign substrates becomes imperative, for both their big standard size (equal to 2"-50.8 mm—or larger diameter) and the possibility of homo-epitaxial growth of III-Nitride devices using in-plane lattice constant engineering, which are not offered nowadays as non-polar bulk substrates. However, as mentioned before, growing a non-polar III-Nitride layer directly on a foreign substrate generates a huge amount of defects. Such kind of III-Nitride layer cannot work as a pseudo-substrate for III-Nitride devices grown on top of it, since they inherit all the defects from it. On the other hand, most of research efforts have been dedicated to high-quality non-polar GaN pseudo-substrates. The achievement of non-polar GaN pseudo-substrates has been expected to trigger a breakthrough of the whole III-Nitride field (US8,338,273 B2, 7,955,983 B2, GB 24885887 B, and US8,652,947 B2). However, currently there are no high quality non-polar AlN, InN, or ternary alloys pseudo-substrates reported or commercially available.

There are two promising approaches to achieve high quality non-polar GaN pseudo-substrates with reduced density of defects: a) the use of dielectric or metal masks for blocking defects (the defects include TDs, SFs and parasitic c-plane GaN inclusions); and b) the use of nano-pillars (also labelled as nano-rods, nano-columns and nano-wires) for filtering defects.

At present, regarding the first approach a), the most established method to grow high-quality GaN pseudo-substrates is based on the use of dielectric or metal masks for blocking defects, such as epitaxial lateral overgrowth techniques (ELOG), sidewall lateral epitaxial overgrowth (SLEO) and Selective Area Growth (SAG) plus coalescence. ELOG reduces TDs and SFs by reinforcing the lateral growth from trenches made out of a mask material (stripes) with a specific width and periodicity, and aligned along a given crystal axis (in-plane). In such a way, the material laterally overgrown on the mask material is free of dislocations that tend to accumulate in places where the different micro-crystals merge, as well as in the "window" areas in the mask. To obtain a full area usable for high-quality devices (homogeneous overgrown layer), one has to perform cumbersome and costly processes with repeated lateral growth steps by using techniques of Double ELOG (U.S. Pat. No. 8,338,273 B2), or SLEO (U.S. Pat. No. 7,955,983 B2). Another drawback of the two lateral growth step process is the need of a 10 to 20 pm thick overgrown material to achieve a flat surface, though this value can be shrunk to 1-2 pm by either SAG with nano-scale openings in the mask (S. Albert, A. Bengoechea-Encabo, J. Zuniga-Perez, P. de Mierry, P. Val, M. A. Sanchez-Garcia, and E. Calleja (2014), *Applied Physics Letters* 105 (9) 091902) and nano-scale SLEO (GB 24885887 B). Very recently 50.8 mm-2"—a-plane GaN on sapphire templates grown by nano-scale SLEO were made commercially available (GB 2488587 B).

However, the above methods have not been applied to III-Nitrides containing Al and/or In elements. As a consequence, the masks used so far for ELOG, SLEO and SAG, as well as the growth conditions, are neither developed, nor checked. There is no scientific evidence that the commonly used mask materials, $SiO_2$, $SiN_x$ and $TiN_x$, work properly for III-Nitrides that contain Al and/or In, because alloys including these elements tend to nucleate on the mask and produce parasitic polar material.

With regard to this problem and concerning the second approach b), there is evidence on the growth of polar AlN that avoid parasitic nucleation only via etched c-plane AlN pillars (Michele Conroy, Vitaly Z. Zubialevich, Haoning Li, Nikolay Petkov, Justin D. Holmes, and Peter J. Parbrook (2015), *J. Mater. Chem.* C3 (2), 431), or a pattern of c-plane GaN nano-pillars grown by SAG (A. Bengoechea-Encabo, S. Albert, M. Muller, M. Y. Xie, P. Veit, F. Bertram, M. A. Sanchez-Garcia, J. Zuniga-Perez, P. de Mierry, J. Christen, and E. Calleja (2017), *Nanotechnology* 28 (36), 365704), since both methods provide efficient shadowing effect. However, there are no works aiming at non-polar AlN pseudo substrates. In the non-polar case, shadowing effect is not achievable because of the preferential in-plane growth. The image shown in (c) in FIG. 4 provides an example of non-polar AlN nano-crystals surrounded by parasitic c-plane AlN grown by SAG using a $TiN_x$ mask. Last but not least, the application of these methods means that the mask remains inside the resulting layers and further into the fabricated devices, thus increasing the risk of contamination and parasitic capacitance effects thereof.

Non-polar nano-pillars have been barely studied, because, contrary to a top-down approach by etching, the growth of non-polar III-Nitrides nano-pillars is typically quite difficult. The growth on c-plane orientation has the highest growth rate among most planes (non-polar, semi-polar) generally used. Thus, attempts to grow non-polar nano-pillars produces nano-crystals where the vertical growth is negligible, yielding a 2D film after a rather fast coalescence. This is what happens when growing non-polar GaN by SAG (S. Albert, A. Bengoechea-Encabo, J. Zuniga-Perez, P. de Mierry, P. Val, M. A. Sanchez-Garcia, and E. Calleja (2014), *Applied Physics Letters* 105 (9) 091902). In addition, when Al and In atoms are involved in the process, there is a strong tendency of parasitic nucleation of c-plane oriented material on the mask (S. Albert, A. Bengoechea-Encabo, M. A. Sanchez-Garcia, E. Calleja, and U. Jahn (2013), *J. Appl. Phys.*, 113 (11) 114306). The negligible vertical growth of non-polar crystals cannot provide efficient shadowing effect that can avoid parasitic nucleation on the mask. This is what happens when growing non-polar AlN using SAG (see (c) in FIG. 4). Therefore, the approach is neither useful to obtain efficient III-Nitrides nano pillars, nor high quality, pure hexagonal 2D non-polar layers, specially ternary III-Nitrides layers, such as Al(Ga)N and In(Ga)N. As SAG is inappropriate to obtain ordered arrays of non-polar III-Nitride nano-pillars with enough shadowing effect, finding out an alternative technique becomes a new challenge.

There are four previous works that show the advantages of using nano-pillars aiming at obtaining a-plane non-polar GaN pseudo-substrates: GB 24885887 B; U.S. Pat. No. 8,652,947 B2; Shih-Chun Ling et al. (2009), *Applied Physics Letters* 94 (25) 251912; and Q. M. Li, Y. Lin, J. R. Creighton, J. J. Figiel, and G. T. Wang (2009), *Adv. Mater.*, 21 (23), 2416). However, the mentioned references also highlight the main drawbacks of the process, specifically about the coalescence of irregularly distributed arrays of nano-pillars.

Indeed, self-assembled (SA) a-plane GaN nano-pillars grown with the help of irregularly distributed Ni nano-dots (Ni-mediated) (Q. M. Li, Y. Lin, J. R. Creighton, J. J. Figiel, and G. T. Wang (2009), *Adv. Mater.*, 21 (23), 2416) are not practical because of the strong dispersion in height and diameter. The coalesced layer resulting from SA nano-pillars exhibits slightly lower TDs values ($10^9$ $cm^{-2}$) compared to 2D films directly growth of on sapphire, a value still very far from the needed values for LED and LD commercial fabrication. TDs in the coalesced layer appear mainly in the coalesced areas between nano-pillars and are not homogeneously distributed, depending strongly on the azimuth direction and on the diameters and mean distance of the original nano-pillars. In the cited document, the new generated TDs at the merged areas are uncontrollable, because of the uncontrollability of both the nano-pillars density and the merging planes in an irregularly distributed array. This is the unavoidable drawback of using an irregular array for preparing nano-pillars. The above work gives another example of the disadvantages of using SA nano-pillars, because not all nano pillars grow perpendicular to the substrate surface, but a significant fraction is tilted at 30° or even 60° from the surface normal direction.

The irregularly distributed arrays of etched GaN nano-pillars (GB 24885887 B, U.S. Pat. No. 8,652,947 B2 and Shih-Chun Ling et al. (2009), in *Applied Physics Letters* 94, (25), 251912, keep a vertical orientation but they are randomly distributed. Therefore, aside from nano-pillars, the three other relevant works above commented use dielectric masks, either to block the penetration of TDs (top mask), or to stop parasitic growth along c-pane GaN (lateral mask). The TDs filtering effect was not exploited upon nano-crystals re-growth. Furthermore, the use of masks hinders the achievement of high-quality non-polar III-Nitrides with Al or In components. The first reference, GB 24885887 B, can be considered as a SLEO process at nano-scale. For this irregular array of etched nano-pillars, the $SiO_2$ mask remains on their top and the growth starts from the nano-pillars sidewalls. The other two references rely on an ex-situ deposition of dielectric masks on the nano-pillars sidewalls after etching. In consequence, the whole process in both of them becomes quite complicated and includes many steps that may be detrimental to the quality and repeatability.

The current disclosure overcomes all the mentioned difficulties and technical problems, achieving non-polar, strain-free III-Nitride compact films on a foreign substrate with a simplified fabrication process, with a low TDs density, estimated in the order of $3 \times 10^7$ $cm^{-2}$. This type of films or layers are usually named in the technical field as 2D films/layers, which is the common term for a coalesced layer, in contrast to 3D grown layers, like columnar layers; the term "2D" just emphasized the smooth surface (i.e. not a columnar surface) without islands on it. When coalescing ordered arrays of etched nano-pillars, the dielectric/metal mask is not needed during the growth of the film to block the defects or avoid parasitic growth as in the previous works. The density of TDs in the coalesced layers becomes controllable and strain due to lattice mismatch with the substrate is removed after etching the nano-pillars.

The present disclosure proves that high-quality III-Nitrides layers can be achieved by a straightforward method of coalescing nano-pillars without using a metal or dielectric mask. The lateral growth upon nano-pillars coalescence process has a strong filter effect on TDs and SFs. Thus, the fabrication process to achieve high quality material can be simplified. Another obvious benefit of using nano-pillars is that they are naturally strain-free, so that the resulting 2D film by coalescence is basically strain free as well, no matter the starting substrate used.

BRIEF SUMMARY

According to a first aspect of the present disclosure, a method for obtaining a non-polar III-Nitride material is provided, including: etching a non-polar III-Nitride template to form a plurality of nano-pillars, where the non-polar III-Nitride template is an m-plane or a-plane oriented single crystal having a formula of $X_xZ_{1-x}N$, where X and Z are independently selected from the group consisting of Ga, In and Al, and $0 \le x \le 1$, the plurality of nano-pillars are arranged along two directions to form an array of nano-pillars, the two directions include a c-direction and an orthogonal direction with respect to the c-direction; growing a III-Nitride on the array of nano-pillars to obtain an array of nano-crystals; and growing a III-Nitride on the array of nano-crystals to form a coalesced non-polar III-Nitride layer, so as to obtain the non-polar III-Nitride material including the array of nano-crystals and the coalesced non-polar III-Nitride layer.

According to a second aspect of the present disclosure, a non-polar III-Nitride material is provided, including: a plurality of nano-crystals; and a non-polar III-Nitride layer, where the plurality of nano-crystals is at least partially embedded in the non-polar III-Nitride layer, the plurality of nano-crystals is arranged along two directions to form an array of nano-crystals, the two directions include a c-direction and an orthogonal direction with respect to the c-direction, each of the non-polar III-Nitride layer and the plurality of nano-crystals is an m-plane or a-plane oriented single crystal material without polymorphism, and each of the non-polar III-Nitride layer and the plurality of nano-crystals independently has a formula of $X_xZ_{1-x}N$, where X and Z are independently selected from the group consisting of Ga, In and Al, and $0 \le x \le 1$.

According to a third aspect of the present disclosure, a device is provided, including: a template or a pseudo-substrate, including a non-polar III-Nitride material, where the non-polar III-Nitride material is obtained by a method including: etching a non-polar III-Nitride template to form a plurality of nano-pillars, where the non-polar III-Nitride template is an m-plane or a-plane oriented single crystal having a formula of $X_xZ_{1-x}N$, where X and Z are independently selected from the group consisting of Ga, In and Al, and $0 \le x \le 1$, the plurality of nano-pillars are arranged along two directions to form an array of nano-pillars, the two directions include a c-direction and an orthogonal direction with respect to the c-direction, growing a III-Nitride on the array of nano-pillars to obtain an array of nano-crystals, and growing a III-Nitride on the array of nano-crystals to form a coalesced non-polar III-Nitride layer, so as to obtain the non-polar III-Nitride material including the array of nano-crystals and the coalesced non-polar III-Nitride layer, or the non-polar III-Nitride material includes: a plurality of nano-crystals, and a non-polar III-Nitride layer, where the plurality of nano-crystals is at least partially embedded in the non-polar III-Nitride layer, the plurality of nano-crystals is arranged along two directions to form an array of nano-crystals, the two directions include a c-direction and an orthogonal direction with respect to the c-direction, each of the non-polar III-Nitride layer and the plurality of nano-crystals is an m-plane or a-plane oriented single crystal material without polymorphism, and each of the non-polar III-Nitride layer and the plurality of nano-crystals independently has a formula of $X_xZ_{1-x}N$, where X and Z are independently selected from the group consisting of Ga, In and Al, and $0 \le x \le 1$.

According to a fourth aspect of the present disclosure, a multi-layer structure, including: two III-Nitride layers with different compositions; and a buffer layer disposed between the two III-Nitride layers, where the buffer layer includes a non-polar III-Nitride material, the non-polar III-Nitride material is obtained by a method including: etching a non-polar III-Nitride template to form a plurality of nano-pillars, where the non-polar III-Nitride template is an m-plane or a-plane oriented single crystal having a formula of $X_xZ_{1-x}N$, where X and Z are independently selected from the group consisting of Ga, In and Al, and $0 \le x \le 1$, the plurality of nano-pillars are arranged along two directions to form an array of nano-pillars, the two directions include a c-direction and an orthogonal direction with respect to the c-direction, growing a III-Nitride on the array of nano-pillars to obtain an array of nano-crystals, and growing a III-Nitride on the array of nano-crystals to form a coalesced non-polar III-Nitride layer, so as to obtain the non-polar III-Nitride material including the array of nano-crystals and the coalesced non-polar III-Nitride layer, or the non-polar III-Nitride material includes: a plurality of nano-crystals, and a non-polar III-Nitride layer, where the plurality of nano-crystals is at least partially embedded in the non-polar III-Nitride layer, the plurality of nano-crystals is arranged along two directions to form an array of nano-crystals, the two directions include a c-direction and an orthogonal direction with respect to the c-direction, each of the non-polar III-Nitride layer and the plurality of nano-crystals is an m-plane or a-plane oriented single crystal material without polymorphism, and each of the non-polar III-Nitride layer and the plurality of nano-crystals independently has a formula of $X_xZ_{1-x}N$, where X and Z are independently selected from the group consisting of Ga, In and Al, and $0 \le x \le 1$.

DETAILED DESCRIPTION

The disclosure is aimed at a method for obtaining non-polar III-Nitride compact layers by coalescence of an ordered-array of etched non-polar III-Nitride nano-pillars. Besides, the disclosure also relates to the non-polar III-Nitride binary and ternary compact, continuous (2D) films, layers, or pseudo-substrates, obtainable by means of the disclosed method and having advantageous properties. Besides, the disclosure includes a specific group of III-Nitride films, having one of the components selected from the group consisting of In, Al and both elements, enfolding ordered arrays of III-Nitride nano-crystals, regardless the method for obtaining thereof; the composition of the III-Nitride film and the composition of the III-Nitride nano-crystal can be different. The mentioned group of films have one of the compositions selected from a group of materials consisting of: non-polar InN, non-polar AlN, non-polar $Ga_xAl_{1-x}N$, non-polar $In_xAl_{1-x}N$ and non-polar $Ga_xIn_{1-x}N$, where $0<x<1$.

Figure 1:
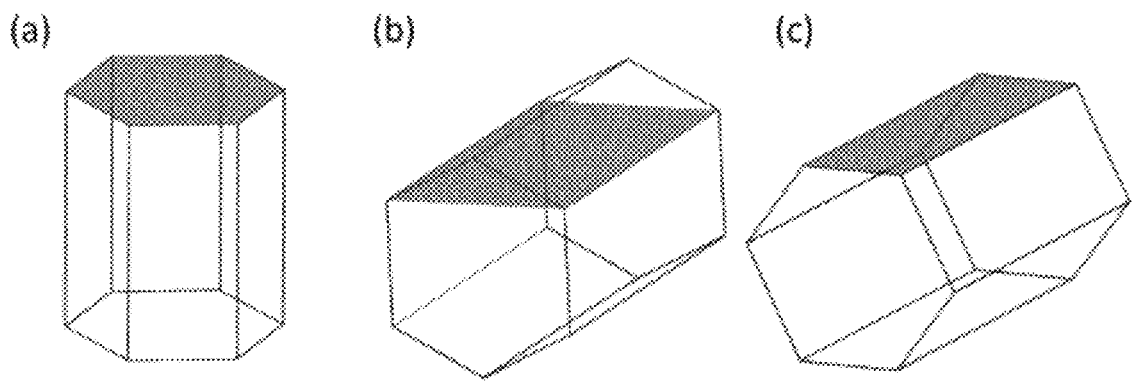
FIG. 1 is a schematic diagram of a) c-plane polar (0001); b) non-polar planes of the hexagonal unit cell in III-Nitrides: a-plane (1120); and c) an m-plane (1010)
Figure 2:
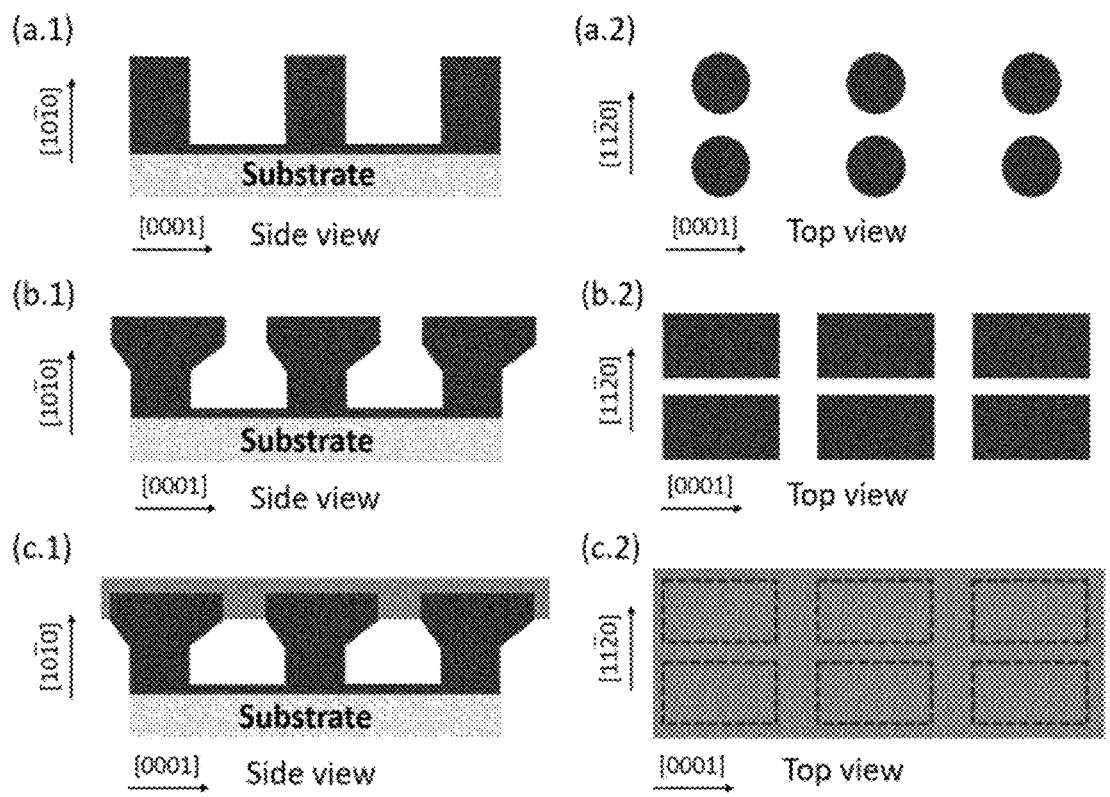
FIG. 2 is a diagram showing the main steps in the fabrication of non-polar III-Nitrides high-quality 2D films: a.1) and a.2) an etched ordered array of non-polar nano pillars; b.1) and b.2) ordered array of non-polar nano-crystals after re-growth; and c.1) and c.2) coalesced 2D film. In the figure the composition of the coalesced III-Nitride layer is different from the composition of the etched nano-pillars or re grown nano-crystals (nano-tiles)

Concerning the first object of the disclosure, the process for obtaining the non-polar III-Nitride binary and ternary layers or films includes the following steps:

a) Fabricating a patterned mask on a non-polar III-Nitride template, and subsequently defining an ordered pattern thereon of holes size ranges from a scale between 20 nm and 2000 nm; the ordered distribution of the holes following a pattern where the distance (pitch) between holes centers lays between 50 nm and 2000 nm; and the III-Nitride template being an m-plane or a-plane oriented single crystal material without polymorphism having the formula: $X_xZ_{1-x}N$, where X and Z are independently selected from a group of elements consisting of: Ga, In and Al, and where $0 \leq x \leq 1$; and the template having a thickness equal or higher than 100 nm;

b) Etching down an ordered array of nano-pillars following the pattern predetermined in the previous step by the mask on to the template;

c) Removing the mask. The resulting structure is called from now on as starting template to achieve the 2D films by coalescence (see (a) in FIG. 2);

d) Re-growing the III-Nitrides on the surface of the etched nano-pillars so that the nano-pillars become nano-crystals, having the same composition as that of the array. In this step, most TDs existing within the nano-pillars will be filtered away (see (b) in FIG. 2). Due to the different growth rates among the planes involved, no matter the original shape of the etched pillar, after growth each nano-pillar becomes a nano-crystal with an upper shape of a rectangular block (from now on nano-tiles as seen in (b) in FIG. 3). These nano-crystals geometry and size allows for an optimal coalescence process in the next step;

e) Coalescing into a 2D film by further growing the III-Nitrides, carried out on the nano-tiles (obtained in the step of re-growth d) (see © in FIG. 2). The compact layer may have the same or different composition (i.e., GaN, AlN, InN or any ternary alloy) as that of the template in step a). Basically, step e) means coalescing into a compact layer by further growing the III-Nitrides, carried out on the nano-crystals obtained in the step d).

FIG. 2 shows a sketch of steps b), c), d) and e): the structure with nano pillars after the removal of the mask (steps b) and c), the re-growth that changes the nano-pillars into nano-tiles (step d), and the further growth to obtain the coalesced III-Nitride film (step e).

Whenever this document refers to "re-growth" in step d), it should be understood that it is the same as saying "growth" in step d), because it is actually the first growing step of the nano-pillars in the essential process.

The distance between nano-pillars centers is between 50 nm-2000 nm with less than 5% deviation from the average value, and the cross-section size of pillars is between 20 nm-2000 nm with a deviation less than 5% from the average value. In some exemplary embodiments, the height of the nano-pillars is between 100 nm and 1000 nm with a deviation of less than 5% from the average value. The said distance, cross-section size and height of the nano-pillars can be measured by using scanning electron microscopy (SEM).

The III-Nitrides template must be single crystal m-plane or a-plane oriented, without twins or phases other than the one specified (no polymorphism) such as mixing with c-plane or zinc-blend (cubic) regions. The non-polar III-Nitride template can be either a) a non-polar III-Nitride 2D layer (named buffer layer) supported on a substrate, or b) the template can be a non-polar III-Nitride substrate (without any buffer layer supported on it). The substrate supporting the non-polar III-Nitride 2D layer can be any substrate, such as a foreign substrate or a (non-polar) III-Nitride substrate. For example, the method can be carried out using a non-polar III-Nitride 2D layer supported by a foreign substrate like SiC or $Al_2O_3$ to achieve large size (equal to 50.8 mm-2"—or larger), low cost (the price is lower than that of a non-polar III-Nitride substrate cut from bulk material) and high-quality (the density of TD is as low as $3 \times 10^7$ cm$^{-2}$) non-polar III-Nitride pseudo-substrates. Also as examples, the disclosed method can be carried out using a non-polar high Ga (more than 80%) composition ternary buffer layer supported by a m-plane GaN substrate cut from a bulk material, to achieve a strain-free medium Ga (about 50%) composition ternary epitaxial 2D layer. Additionally, the method can be carried out to achieve strain-free m-plane InN layer using a m-plane GaN substrate without any buffer layer. In any case, the template has a thickness equal or higher than 100 nm.

In some exemplary embodiments, the method may include a previous, starting step of growing a non-polar III-Nitride uniform 2D layer (buffer layer) on a substrate, which may be a foreign substrate, having a thickness equal or higher than 100 nm, the layer being the m-plane or a-plane oriented single crystal material without polymorphism.

The challenge to achieve a homogeneously distributed array of nano-tiles depends crucially on the balance between the different in-plane growth rates along polar and non-polar directions, as well as on the geometrical arrangement of the nano-pillars array, i.e., the nano-pillar distances along the c-direction and the orthogonal in-plane one.

The present disclosure proves that, for obtaining high-quality non-polar III-Nitride pseudo-substrates, ordered arrays of nano-pillars with controlled position, diameters and height, as defined before, are more suitable to control coalescence and high quality 2D (compact) layer with a reduced density of TD. First of all, the height, diameter and distance (pitch) between nano-pillars centers are optimized for providing efficient shadowing effect so that parasitic nucleation can be avoided without the assistance of a mask. The efficient shadowing effect also ensures the growth of non-polar III-Nitrides without the appearance of parasitic c-plane material. Secondly, it is worth to mention again that, the coalescence between arbitrary and multiple crystal planes results in a high TD density, so that, the crucial benefit of this disclosure is that it provides well aligned and homogeneously distributed arrays of nano-tiles where only two in-plane orientations play a role during coalescence, the so called "two-dimensional coalescence". For this purpose, a critical aspect is the distance between nano-pillars, which depends on their pitch and diameter. If too big, coalescence may become difficult and parasitic nucleation of c-plane (vertical) material may happen. If too small, nano-crystals merging will develop too fast, hindering the chances to change the material (i.e. from GaN to AlN) before partial coalescence occurs. TDs at the merging areas are then controllable when the density of nano-pillars and the merging planes, namely the nano-pillars position and twist, are under control. In grown nano-pillars the diameter and height are critical parameters to reduce the number of TDs inherited from the non-polar III-Nitride template (P. Aseev, Z. Gacevic, A. Torres-Pardo, J. M. Gonzalez-Calbet, and E. Calleja (2016), *Applied Physics Letters* 108 (25), 253109). In etched nano-pillars, the smaller the diameter, the lower the probability to have dislocations that could eventually get into the coalesced layer.

Therefore, the disclosure provides ordered arrays of nano-pillars with manageable parameters as the key to achieve low TDs density and parasitic-nucleation-free non-polar III-Nitride layers, with or without Al/In elements.

Thanks to this process, the intended product can be grown on a large size (equal to 50.8 mm-2"—or larger) foreign substrates via a non-polar III-Nitride buffer layer, becoming a large size, high-quality and low-cost pseudo-substrates. The cost is low not only because the simplified fabrication process of coalescing nano-pillars from an etched ordered array, but also because of the use of low-cost foreign substrates, such as sapphire. As mentioned, the III-Nitride etched nano-pillars get free of the strain due to the lattice-mismatch with the foreign substrate. The optimized etched ordered-array overcomes all the disadvantages of SA, or random distributed nano-pillars, as mentioned in the previous section, minimizing the density of TDs (down to $3 \times 10^7$ $cm^{-2}$, estimated from the number of lateral boundaries of the merging nano-pillars) in the coalesced layer.

In addition this process rules out the need of keeping a dielectric/metal mask in the structure of the final product, which may eventually induce parasitic growth on it.

As stated above, the second object of the disclosure is directed to a series of non-polar III-Nitride binary and ternary compact films/layers obtainable by means of the disclosed process, i.e. the compact layer is coalesced from etched nano-pillars in an ordered array. Here "μl-Nitrides" include ternary alloys $Ga_xAl_{1-x}N$, $In_xAl_{1-x}N$ and $Ga_xIn_{1-x}N$ (0<x<1), as well as the binaries, GaN, AlN and InN, denoted as $X_xZ_{1-x}N$ with cations X and Z indicate In, Ga and Al, 0≤x≤1. The group of materials covered by this disclosure are formed by the following compositions: non-polar GaN, non-polar AlN, non-polar InN, non-polar $Ga_xAl_{1-x}N$, non-polar $In_xAl_{1-x}N$ and non-polar $Ga_xIn_{1-x}N$, where 0<x<1.

It is obviously derived from the above description that the resulting outcome can be a multi-layered material including at least:
 a layer that is the non-polar III-Nitride template, processed as an ordered (etched) array of nano-pillars further developing into nano-crystal rectangular blocks (nano-tiles) after re-growth;
 a continuous growth results in coalesced non-polar II-Nitride layer supported by the nano-pillars, specifically by the nano-tiles; where the re-grown nano-crystal has a composition that is the same as or different from the composition of the non-polar III-Nitride film.

The third object of the disclosure also relates to a specific group of non-polar III-Nitrides single crystal films, m-plane or a-plane oriented, regardless the method for obtaining thereof, following the formula:
 $X_xGa_{1-x}N$, where cation X indicates In or Al and 0<x≤1: or
 $In_xAl_{1-x}N$, where 0<x≤1;

The film includes nano-crystal rectangular blocks (nano-tiles) in an ordered array, totally or partially embedded in the single crystal film, said blocks having the formula $X_xZ_{1-x}N$, where X and Z are independently selected from the group-ill elements Ga, In and Al, and where 0≤x≤1.

A substrate may be included as the support of the final product.

The product claimed in the present disclosure is free of contamination and parasitic capacitance risks arising from buried masks when devices are made on top. In summary, the disclosure provides non-polar III-Nitride 2D films with a variety of compositions, providing an in-plane lattice constant engineering that allows further homo-epitaxial growth of strain free (or much reduced) III-Nitride optoelectronic or electronic devices. Of particular interest is the engineering of in-plane lattice constant to achieve high A % and In % in QWs for LED and LDs in the deep UV and green-orange-red emission devices. Generally speaking, compared to III-Nitride templates, or pseudo-substrates presently available in the market, the product of the disclosure has non-polar orientation, larger size, lower price and high quality. Besides, this product allows a basis for a sequential process to fabricate tandem devices, such a tandem solar cell.

The disclosure relies on ordered arrays of etched nano-pillars. For the non-polar III-Nitrides template, etched pillars can provide enough height for an efficient shadowing effect. Besides, coalescence occurs basically in-plane along the c- and m-/a-directions what involves only two orthogonal planes for merging (a 2D merging). The two crystal planes involved in coalescence do not present the same growth rate, i.e. c-plane is always faster. Therefore, a rectangular shaped pattern of the array is needed (see FIGS. 2 and 3). Furthermore the pitch along c- and m-/a-directions and the size of nano-crystals after regrowth are precisely determined. The material grown on the etched nano-pillars is TDs-free, but new TDs may appear at merging areas. The optimization of the array geometry and pitch (density of nanopillars) with negligible twist via the optimization of the growth conditions leads to minimize these new TDs. Nano pillars density depends on diameter and pitch, and care must be taken, since a low density may trigger parasitic growth (for a given height) by a critically low shadowing effect. Another parameter to control shadowing effect is the depth of etching (nano-pillars height). All these variables provide a strong flexibility to design the optimum array geometry. On the other hand, a rather large diameter (a packed array) would trigger an early coalescence before nano-tiles are properly aligned. As stated before, the best ranges for the three parameters involved in optimization are: distance between nano-pillars centers or pitch: 50 nm-2000 nm with less than 5% deviation from the average value; the cross-section size of pillars (diameter for columnar pillars): 20 nm-2000 nm with a deviation less than 5% from the average value; and height: 100 nm-1000 nm with a deviation of less than 5% from the average value.

When a range is disclosed in the present disclosure, the lower and upper limits are included as part of the disclosure.

Here is a specific example of parameters choice for etched m-plane GaN nano-pillars to fabricate an m-plane GaN 2D layer by SAG MBE: an ordered array following a rectangular pattern of m-plane GaN nano-pillars with 200 nm diameter, 2000 nm pitch along c-direction, 1500 nm pitch along a-direction in azimuth and 1000 nm etching depth that will provide effective shadowing effect and would result in a coalesced m-plane GaN 2D layer with TDs density of $3\times10^7$ cm$^{-2}$ (estimated from the number of lateral boundaries of the merging nano pillars).

The present disclosure also relates to the use of the disclosed products, not only those obtained by means of the method, but also the novel group of non polar films here described, as starting template or pseudo-substrate to develop optoelectronic devices as well as high-power devices and high-frequency devices. As optoelectronic devices UV LEDs and visible LEDs; UV LD and visible LD; and solar cells are considered. As high-power devices and high frequency devices field effect transistors and bipolar transistors are envisaged. The pseudo substrates can also be used as strain-free layers between any two III-Nitride layers having different composition, for devices like tandem solar cells.

The fabrication process, as disclosed in the present disclosure, may include the following detailed steps:

a) The mask may be a metal mask, or a Ni mask. The mask is deposited by conventional methods (Joule and e-beam evaporation, etc.) and the mask pattern processed by Electron-Beam Lithography (EBL), Nano-Imprint (NIL), or optical lithography for nano/micro pillars. NIL is the technique of choice because it provides the fastest method covering wide areas. The holes can have the shape of a circle, a rectangle, a square, or a triangle. The pattern (the distribution) of the holes array in the mask can have a geometry selected from a group consisting of: triangle, square, polygon such as diamond, parallelogram, hexagon or any mixture, with a well-defined orientation. Considering the inhomogeneous growth rate of different azimuth planes of non-polar III-Nitrides, the geometry of the pattern of holes array may be a rectangle with the long edge oriented along the [0001] direction (c-plane) as shown in the top view of (a) in FIG. 2.

The process can start by previously growing a non-polar III-Nitride buffer layer having a-plane or m-plane orientation on a substrate. In some exemplary embodiments, the substrate may be selected from the group consisting of: Al$_2$O$_3$, SiC, Si, LiAlO$_2$ (LAO), LiGaO$_2$ (LGO), m-plane GaN and m-plane AlN substrate. The III-Nitride buffer layer stands for any alloy such as: X$_x$Z$_{1-x}$N, where X and Z are independently selected from the group-ill (Ga, In, Al) and where 0<x<1. More specifically, the III-Nitride buffer layer can be any of the following: GaN, AlN, InN, Al$_x$Ga$_{1-x}$N, In$_x$Ga$_{1-x}$N, and In$_x$Al$_{1-x}$N, where 0<x<1.

If the template is a non-polar III-Nitride 2D substrate, said substrate is selected from the group consisting of: GaN, AlN, InN, Al$_x$Ga$_{1-x}$N, In$_x$Ga$_{1-x}$N, and In$_x$Al$_{1-x}$N, where 0<x<1.

Figure 3:
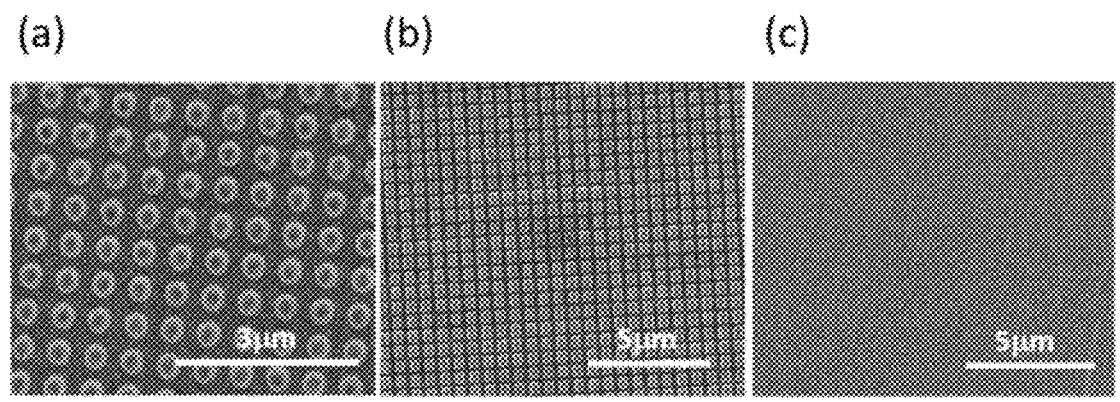
FIG. 3 is a diagram showing scanning electron microscopy (SEM) top view images of: a) an etched ordered array of m-plane nano-pillars; b) ordered array of m-plane nano-crystals after re-growth; and c) two-dimensional (in-plane) coalescence into a 2D m-plane film.
Figure 7:
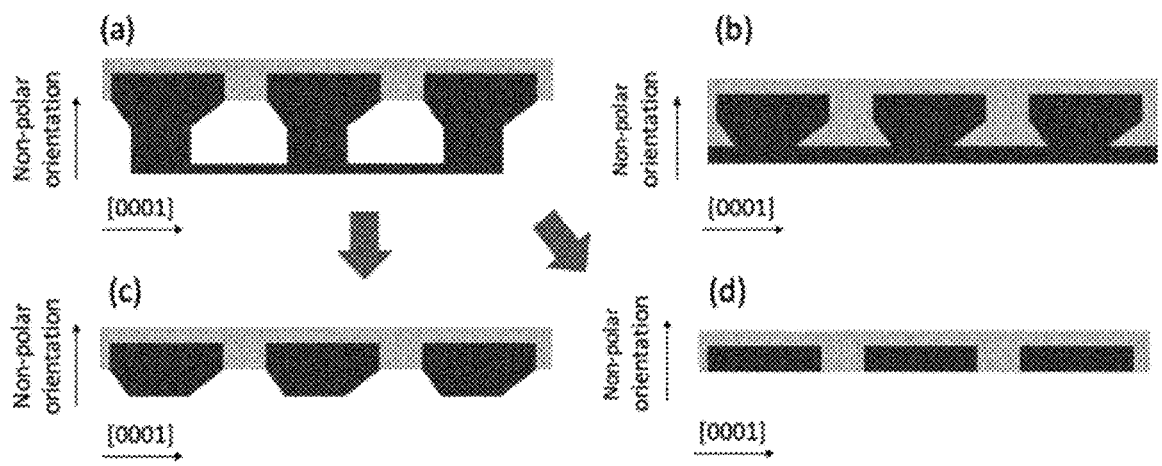
FIG. 7 shows some examples of independent products, the structure of the non-polar III-Nitride binary and ternary (with In and/or Al elements) 2D film enfolding partially or totally ordered array of III-Nitride nano-crystals disclosed in the present disclosure, when the film and the nano-crystals have a different composition: a) The top part of III-Nitride nano-crystals embedded partially into the bottom of a compact layer; b) the entire III-Nitride nano-crystals embedded into the bottom of a compact layer; c) and d) are the two possible situations for the structure in (a) in FIG. 7, when the 2D film is separated from the foreign substrate.

The surface orientation of the template determines that of the final 2D coalesced film at the end of the process. The Section with examples presents two exemplary buffers: a-plane GaN on (1122) Al$_2$O$_3$ and m-plane GaN on (100) LiAlO$_2$ grown by MOVPE and MBE, respectively.

b) In the second step, Inductively Coupled Plasma technique (ICP) may be used to etch an ordered array of nano-pillars with the geometry and orientation determined by the mask pattern down to a given depth. The shape of the resulting nano-pillars cross section shape can be of any type or form. (a) in FIG. 2 is a schematic diagram of the etching process, while (a) in FIG. 3 shows an SEM picture of the resulting nano-pillars that have a slight truncated conical shape instead of a pure cylindrical one. This is not detrimental to the process of re-growth and TDs filtering, but even better.

c) Before performing re-growth on the etched nano-pillars, the remaining Ni mask is removed, for example, with a FeCl$_3$ solution.

d) Time needed for the re-growth depends on the technique and conditions used. Any known growth technique like MOVPE, halide vapour phase epitaxy (HVPE), MBE, chemical beam epitaxy (CBE), sputtering or physical vapour transport (PVT) may be used. When MBE is used to grow l-Nitrides, a specific III/V ratio depending on the material and final layer morphology must be used in a temperature range from 450° C.-1000° C., both limits included, said temperature depending on the material composition. After the re-growth, the shape of the etched nano-pillars evolves into the typical shape of non-polar nano-crystals, i.e., nano-tiles, no matter the initial nano-pillar shape. The re growth of nano-crystals is the last step before the coalescence process into a 2D layer. The re-growth occurs mainly along orthogonal directions, being faster along the c-direction, while the vertical growth on top is quite small, Depending on the nano-pillars length and pitch (as well as impinging angle for MBE case), the lateral re-growth may occur on the whole length of the nano-pillars down to the bottom, or stop midway. If the length is longer than the pitch, the nano crystals look like in (a) in FIG. 7, otherwise, as in (b) in FIG. 7 in which the remaining uncovered part of the nano-crystals is very small or negligible.

In order to obtain a homogeneous coalescence of the nano-crystals, the nano-pillars array geometry must balance the different growth rates along the two in-plane directions involved in coalescence. During re-growth the nano-pillars elongate faster towards the c-direction with clearly defined facets. (b) in FIG. 3 shows the SEM top view image of the resulting ordered array of m-plane GaN nano-crystals after MBE re-growth, where a clear shape change from truncated cones to slightly rectangular tiles is observed. During this process, most TDs within the nano-pillars bend towards the nano-crystals lateral free surface and annihilate.

e) The final step is the controlled coalescence by further growth on the nano-tiles pattern by merging them along two in-plane orthogonal directions which yields a 2D layer ((c) in FIG. 3). The only TDs are those generated upon nano-crystal lateral merging and the fact that only two crystal facets play a role, this will give rise to a limited TDs density. As mentioned before, the coalesced layer and the ordered array of nano-crystals can be III-Nitrides with the same or different composition. For example, obtaining a 2D AlN layer needs the re-growth of GaN nano-crystals first, followed by that of AlN ones before any coalescence is produced. Thus, the final 2D layer is strain-free with a low TDs density. SFs density is also reduced because SFs run perpendicular to the starting template surface, i.e. along the nano-pillars cylinder generator vector (vertical), but nano crystals grow basically along lateral directions, so, free of SFs.

In some exemplary embodiments, the process may include, after growing a high-quality non-polar coalesced III-Nitride layer in step e), an additional step of homoepitaxial overgrowth of a thicker layer to obtain a flat and smooth surface and to establish the desired conductivity (doping). This thick layer can be doped either n- or p-type (with Si and Mg). In this way, the nano-crystals re-growth step will not be modified (if this is the case) by the doping interfering in the coalescence process.

In some exemplary embodiments, the method may further include a step for removing the substrate and/or separating the non-polar III-Nitride compact layer from the lower remaining part of the template in which the formed layer is supported after coalescence in step e), keeping part of the nano-pillars, or none. This step may be carried out when using the compact layer as pseudo substrate or template for the growth of III-Nitride devices. Said step may be carried out by breaking the nano-pillars (i.e., by laser, ultrasonic bath, mechanical stress, etc.). The resulting product is a non-polar wurtzite III-Nitride binary or ternary layer, m-plane or a-plane oriented single crystal material without polymorphism. Said films included rectangular blocks of a single crystal array, totally or partially embedded in the lower surface of the overgrown film.

It must be stated that this step for removing the substrate and/or separating the non-polar III-Nitride layer from the lower remaining part of the template can be carried out either before or after the step of homoepitaxial overgrowth of a thicker layer, or said in other words: the homoepitaxial overgrowth of the thicker layer can be carried out either after or before the separation step. The order of these steps after step e) can be exchanged.

As stated in the previous section, the disclosure also relates to the materials obtainable by means of the methods described herein. Said materials have the improved properties discussed before and any of the compositions/structures disclosed. This statement includes the case in which the non-polar III-Nitride binary and ternary film is separated from the nano-pillars and the substrate.

The final compact layer, the starting template, and the re-grown nano crystals may have the same or different compositions. In the case of the products directly obtained by means of the claimed method, the nano-pillars and nano-crystals may have a composition that is the same as or different from the composition of the III-Nitride layer that is finally grown in the process.

In the case of the claimed products that are defined independently from the method for obtaining thereof, the nano-pillars and nano-crystals have a composition different than that of the III-Nitride compact layer. Consequently, the non-polar III-Nitride layer is always enfolding an ordered array of III-Nitride nano crystals partially or totally embedded in the lower part of the coalesced layer. Said III-Nitride nano-crystals have a different composition than that of the layer. The blocks of nano-crystals have a shape selected from the group consisting of cuboid, frustum and a combination of both, the top view being rectangular.

Apart from the materials obtainable by means of the method, the disclosure also relates to a group of materials that are non-polar III-Nitride binary and ternary films or layers with the formula commented in the previous section. They are not all the products that may be obtained by means of the method, but just a specific group of non-polar III-Nitride binary and ternary 2D films or layers. In some exemplary embodiments, the rectangular blocks are totally embedded in the film (see (a) in FIG. 7), whereas in some exemplary embodiments the blocks are only partially embedded in the film, that is to say: there is a protruding part of the block from the surface of the film (see (b) in FIG. 7).

In another particular case, the material or product is a non-polar III-Nitride binary or ternary film supported on the rectangular blocks, which are the upper part of an ordered array of nano pillars following a specific pattern. What has been disclosed in the method for the pattern and the composition of the nano-pillars also applies to this group of non-polar films.

Obtain an m-plane AlN pseudo-substrate by MBE

This example shows the growth process of a high-quality m-plane AlN 2D layer grown by MBE. The process starts by growing an m-plane GaN buffer layer on a (100) γ-LiAlO$_2$ substrate using a plasma-assisted MBE (PA-MBE) system. Thermal NIL technique was used to define the pattern on a Ni film previously deposited on the buffer.

Then a nano-pillar array is dry etched out of the buffer to the required depth and optimized geometry (a half micrometer and a disk shape, respectively, for the two parameters) using ICP with a BCl$_3$:Cl$_2$ (20 sccm:10 sccm) mixture at room temperature and pressure below $1 \times 10^{-5}$ torr.

Afterwards, the Ni disks were removed from the top of each pillar using FeCl$_3$ solution.

A square pattern, as shown in FIGS. 2 and 3, was obtained with pitch size along c- and a-directions of 625 nm. However, it may be a rectangular pattern with the distances between nano-pillars along c- and a-directions determined as a function of the growth rates of a-plane and c-plane for AlN under the given growth conditions.

A re-growth process of the GaN on nano-pillars helps first to recover etching damage and to further develop a homogeneous array of rectangular shaped nano-crystals (nano-tiles) that are strain-free and virtually free of TDs. To obtain AlN pseudo-substrates, this is the very step where AlN nano-crystals are overgrown on the GaN nano-tiles array. Finally, a 2D m-plane AlN layer was obtained by coalescence of the AlN nano-crystals.

Figure 4:
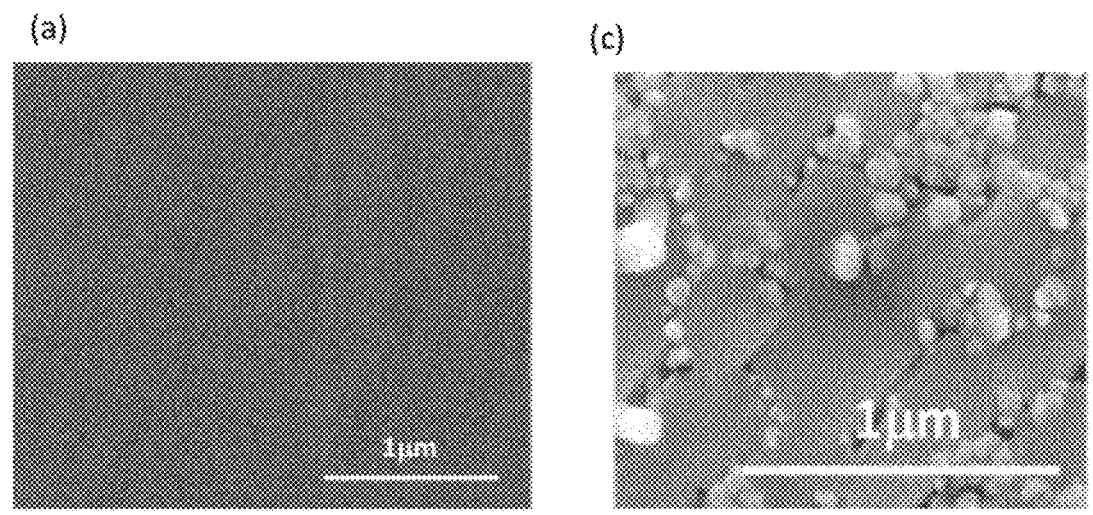
FIG. 4 is a diagram showing characterization results of coalesced non-polar AlN layers: a) SEM image of the surface and b) X-ray diffraction (XRD) θ/2θ spectrum of coalesced m-plane non-polar AlN layer fabricated by the method described in the current disclosure; c) SEM image of the surface of non-polar AlN grown by SAG with the help of a metal mask (poor shadowing effect)
Figure 4:
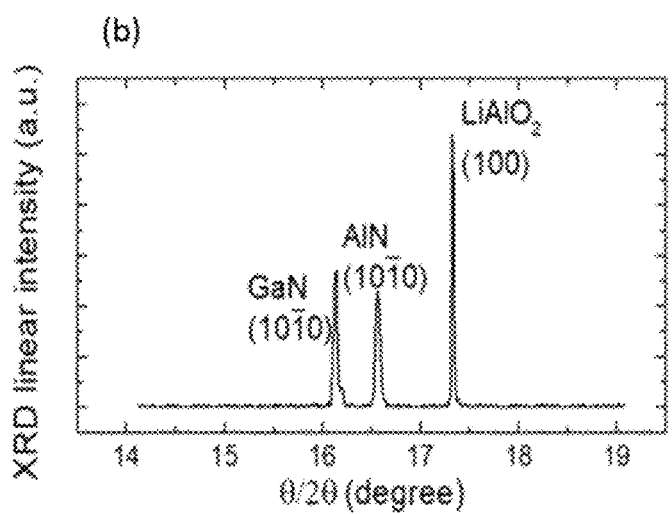

(a) and (b) in FIG. 4 show characterization results of coalesced m-plane non-polar AlN layer. (a) in FIG. 4 is an SEM image shows a coalesced m-plane non polar AlN layer with a smooth surface. High-resolution X-ray diffraction (XRD) Q/2Q spectrum in (b) in FIG. 4 and further XRD measurements (not shown here) reveal the growth of single crystal m-plane non-polar AlN without any other different phases or orientations. There is no availability of non-polar AlN pseudo substrates in the market. When growing a non-polar AlN pseudo-substrate with the help of any kind of mask (no shadowing effect), parasitic nucleation of c-plane (vertical) AlN develops on the mask, as shown in (c) in FIG. 4.

Figure 5:
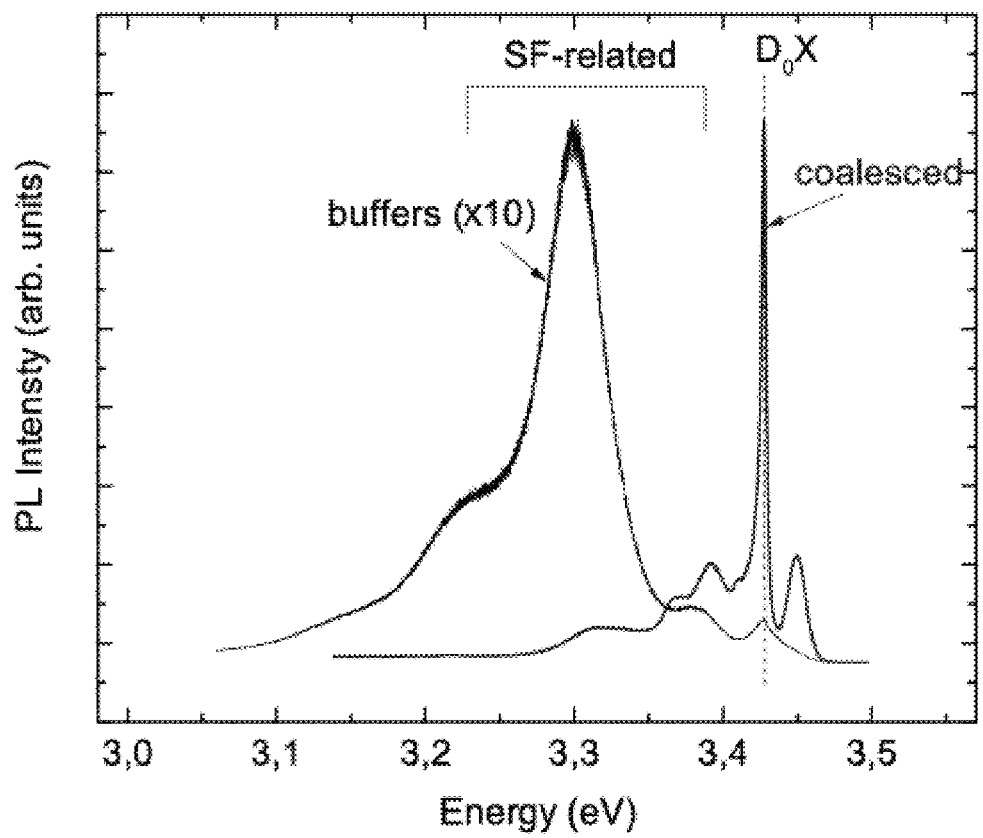
FIG. 5 is a diagram showing low temperature (10K) photoluminescence spectra of: m-plane GaN layers grown directly on a foreign substrate (buffers) and m-plane GaN layers grown by using the method described in the current disclosure (coalesced)

The benefits of the disclosure are pertinent to both m-plane and a-plane for III-Nitrides with any composition. The growth process can proceed with non-polar III-Nitrides with any composition to obtain high-quality pseudo substrates. FIG. 5 shows PL spectra from m-plane GaN buffer grown directly on (100) γ-LiAlO$_2$ and the final m-plane GaN layer grown following the process (coalesced). The intense and sharp excitonic emission (DoX) in the spectrum of the coalesced layer, in contrast to the DoX in the buffer spectrum indicates a much better optical quality of the coalesced layer in the first case, where, in addition, a dramatic decrease of the SF/DoX intensity ratio is observed.

Obtain an m-plane InGaN/GaN strain-free layer for a InGaN—GaN tandem solar cell by MBE.

Figure 6:
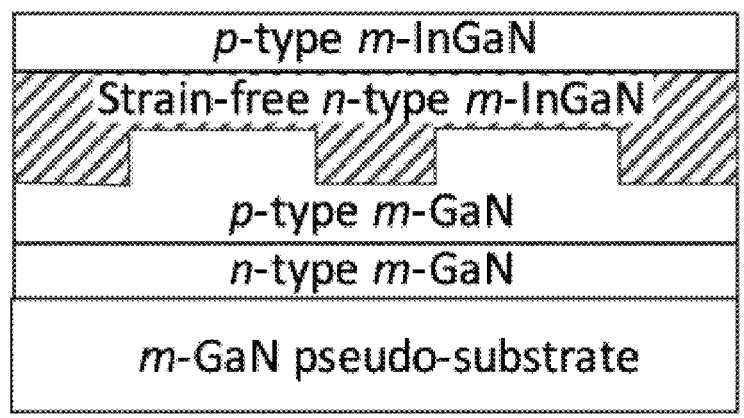
FIG. 6 is a schematic lateral view of a III-Nitride device prepared according to the present disclosure.

As mentioned above, the proposed method is also suitable to fabricate multi-layered (tandem) devices where each layer may have different composition, being also strain free without using dielectric masks. This example shows the way to produce a low TD density and strain-free m-plane InGaN layer on an m-plane GaN p-n junction grown by MBE. On the strain-free m-plane InGaN layer, further grown produces an m-plane InGaN p-n junction for a InGaN—GaN tandem solar cell. FIG. 6 shows the sketch of the m-plane InGaN—GaN tandem solar cell with strain-free p-type m-plane InGaN layer (pattern fill) grown by the proposed method.

Growing an m-plane InGaN layer directly on an m-plane GaN to form a p-n junction will bring strain to the m-plane InGaN layer due to lattice mismatch between InGaN and GaN. This strain, if relaxed, will critically harm the cell performance because of TDs generation. Strain will most likely relax because the thicknesses involved to obtain a desired absorption of light will be beyond the critical thickness.

A high-quality m-plane GaN p-n junction is homo-epitaxially grown on an m-plane GaN pseudo-substrate. The upper p-type GaN layer of the m-plane GaN p-n junction can act as the GaN buffer. Then the same growth process can be applied to the n-type m-plane InGaN layer except for a few differences: a) The upper p-type GaN layer of the m-plane GaN p-n junction could be grown thinner than the GaN starting template, for the etched p-type GaN nano-pillars from it are only used to release the strain between the p-type GaN layer and the n-type m-plane InGaN layer; b) the time for the re-growth of p-type GaN should be shorter than the re-growth of unintentional doped GaN, for the p-type dopants (Mg) may accelerate the lateral growth rate, namely the coalescence of the etched GaN pillars; c) for n-type doping, Si can be used once the InGaN coalescence starts to avoid premature coalescence induced by silicon doping. When performing the growth by MBE the whole growth process, including the re-growth of Mg-doped GaN and the coalescence of the Si-doped InGaN can be accomplished in the same run.

What is claimed is:

1. A method for obtaining a non-polar III-Nitride material, comprising:
   etching a non-polar III-Nitride template to form a plurality of nano-pillars, wherein the non-polar III-Nitride template is an m-plane or a-plane oriented single crystal having a formula of $X_xZ_{1-x}N$, where X and Z are independently selected from the group consisting of Ga, In and Al, and $0 \leq x \leq 1$, the plurality of nano-pillars are arranged along two different directions to form an ordered array of nano-pillars, the two different directions include a c-direction and an orthogonal direction with respect to the c-direction, wherein a cross-section of the nano-pillars is a circle, a cross-sectional size ranging from 20 nm to 2000 nm, and a pitch between centers of two nano-pillars ranging from 50 nm to 2000 nm, and the nano-pillars have a height ranging from 100 nm to 1000 nm;
   growing a first III-Nitride on the ordered array of nano-pillars to make the ordered array of nano-pillars to grow into an ordered array of nano-crystals, wherein a material of the first III-Nitride is the same as a material of the ordered array of nano-pillars; and
   growing a second III-Nitride on the ordered array of nano-crystals to form a coalesced non-polar III-Nitride layer, wherein a material of the second III-Nitride is different from the material of the first III-Nitride.

2. The method according to claim 1, wherein the ordered array of nano-pillars is uniformly arranged in the two different directions, and a pitch between two adjacent nano-pillars in the c-direction is larger than a pitch between two adjacent nano-pillars in the orthogonal direction.

3. The method according to claim 1, further comprising:
   prior to etching the non-polar III-Nitride template, forming a patterned mask on the non-polar III-Nitride template.

4. The method according to claim 3, further comprising:
   prior to growing the III-Nitride on the ordered array of nano-pillars, removing the patterned mask to expose a top surface of the ordered array of nano-pillars.

5. The method according to claim 1, wherein the non-polar III-Nitride template is a non-polar III-Nitride 2D layer grown on a first substrate, or the non-polar III-Nitride template is a non-polar III-Nitride substrate.

6. The method according to claim 5, wherein the first substrate is selected from the group consisting of $Al_2O_3$, SiC, Si, $LiAlO_2$, $LiGaO_2$, m-plane GaN and m-plane AlN; and the non-polar III-Nitride substrate is formed by cutting from a III-Nitride bulk material selected from the group consisting of GaN, AlN, InN, $Al_xGa_{1-x}N$, $In_xGa_{1-x}N$ and $In_xAl_{1-x}N$, where $0<x<1$.

7. The method according to claim 5, wherein the non-polar III-Nitride template is formed by growing the non-polar III-Nitride 2D layer having a thickness of equal to or greater than 100 nm on the first substrate, wherein the non-polar III-Nitride 2D layer is an m-plane or a-plane oriented single crystal without polymorphism.

8. The method according to claim 1, further comprising:
   after growing the III-Nitride on the ordered array of nano-crystals to form the coalesced non-polar III-Nitride layer, homoepitaxially overgrowing a thick layer on the coalesced non-polar III-Nitride layer.

9. The method according to claim 1, further comprising:
   after growing the III-Nitride on the ordered array of nano-crystals to form the coalesced non-polar III-Nitride layer, performing at least one of:
      separating the non-polar III-Nitride layer from the template, or
      separating the non-polar III-Nitride layer from a remaining part of the template supporting the non-polar III-Nitride layer.

10. A non-polar III-Nitride material, comprising:
    a plurality of nano-crystals; and
    a non-polar III-Nitride layer, wherein
    the plurality of nano-crystals is at least partially embedded in the non-polar III-Nitride layer, the non-polar III-Nitride layer is formed by growing a second III-Nitride on the plurality of nano-crystals,
    the plurality of nano-crystals is arranged along two different directions to form an ordered array of nano-crystals, the two different directions include a c-direction and an orthogonal direction with respect to the c-direction, wherein the ordered array of nano-crystals is formed by growing a first III-Nitride on an ordered array of nano-pillars, a cross-section of the nano-pillars is a circle, a cross-sectional size ranging from 20 nm to 2000 nm, and a pitch between centers of two nano-pillars ranging from 50 nm to 2000 nm, and the nano-pillars have a height ranging from 100 nm to 1000 nm, a material of the first III-Nitride is the same as a material of the ordered array of nano-pillars, and a material of the second III-Nitride is different from the material of the first III-Nitride,
    each of the non-polar III-Nitride layer and the plurality of nano-crystals is an m-plane or a-plane oriented single crystal material without polymorphism, each of the non-polar III-Nitride layer and the plurality of nano-crystals has a component selected from the group consisting of GaN, AlN, InN, $Al_xGa_{1-x}N$, $In_xGa_{1-x}N$ and $In_xAl_{1-x}N$, where $0<x<1$ and each of the non-polar III-Nitride layer and the plurality of nano-crystals independently has a formula of $X_xZ_{1-x}N$, where X and Z are independently selected from the group consisting of Ga, In and Al, and $0≤x≤1$.

11. The non-polar III-Nitride material according to claim 10, wherein the ordered array of nano-pillars is uniformly arranged in the two different directions, and a pitch between two adjacent nano-crystals in the c-direction is larger than a pitch between two adjacent nano-crystals in the orthogonal direction.

12. The non-polar III-Nitride material according to claim 10, wherein a cross-sectional shape of each nano-crystal is a rectangle, two long sides of the rectangle extend in the c-direction, and two short sides of the rectangle extend in an a-direction or an m-direction.

13. The non-polar III-Nitride material according to claim 10, wherein a composition of the plurality of nano-crystals is different from a composition of the non-polar III-Nitride layer.

14. The non-polar III-Nitride material according to claim 10, wherein the non-polar III-Nitride layer includes at least one of Al, or In.

15. A device, wherein the device includes an optoelectronic device, a high-power electronic device, and a high-frequency electronic device; the device comprising:
a template or a pseudo-substrate, including a non-polar III-Nitride material, wherein
the non-polar III-Nitride material is obtained by a method including:
etching a non-polar III-Nitride template to form a plurality of nano-pillars, wherein the non-polar III-Nitride template is an m-plane or a-plane oriented single crystal having a formula of $X_xZ_{1-x}N$, where X and Z are independently selected from the group consisting of Ga, In and Al, and $0≤x≤1$, the plurality of nano-pillars are arranged along two different directions to form an ordered array of nano-pillars, the two different directions include a c-direction and an orthogonal direction with respect to the c-direction, wherein a cross-section of the nano-pillars is a circle, a cross-sectional size ranging from 20 nm to 2000 nm, and a pitch between centers of two nano-pillars ranging from 50 nm to 2000 nm, and the nano-pillars have a height ranging from 100 nm to 1000 nm;
growing a first III-Nitride on the ordered array of nano-pillars to make the ordered array of nano-pillars to grow into obtain an ordered array of nano-crystals, wherein a material of the first III-Nitride is the same as a material of the ordered array of nano-pillars; and
growing a second III-Nitride on the ordered array of nano-crystals to form a coalesced non-polar III-Nitride layer, wherein a material of the second III-Nitride is different from the material of the first III-Nitride, or
the non-polar III-Nitride material includes:
a plurality of nano-crystals; and
a non-polar III-Nitride layer, wherein
the plurality of nano-crystals is at least partially embedded in the non-polar III-Nitride layer, the non-polar III-Nitride layer is formed by growing a second III-Nitride on the plurality of nano-crystals,
the plurality of nano-crystals is arranged along two different directions to form an ordered array of nano-crystals, the two different directions include a c-direction and an orthogonal direction with respect to the c-direction, wherein the ordered array of nano-crystals is formed by growing a first III-Nitride on an ordered array of nano-pillars, a cross-section of the nano-pillars is a circle, a cross-sectional size ranging from 20 nm to 2000 nm, and a pitch between centers of two nano-pillars ranging from 50 nm to 2000 nm, and the nano-pillars have a height ranging from 100 nm to 1000 nm, a material of the first III-Nitride is the same as a material of the ordered array of nano-pillars, and a material of the second III-Nitride is different from the material of the first III-Nitride, each of the non-polar III-Nitride layer and the plurality of nano-crystals is an m-plane or a-plane oriented single crystal material without polymorphism, each of the non-polar III-Nitride layer and the plurality of nano-crystals has a component selected from the group consisting of GaN, AlN, InN, $Al_xGa_{1-x}N$, $In_xGa_{1-x}N$ and $In_xAl_{1-x}N$, where $0<x<1$, and each of the non-polar III-Nitride layer and the plurality of nano-crystals independently has a formula of $X_xZ_{1-x}N$, where X and Z are independently selected from the group consisting of Ga, In and Al, and $0≤x≤1$.

16. The device according to claim 15, wherein;
the optoelectronic device is selected from the group consisting of a light emitting diode (LED), a laser diode (LD), and a solar cell, and
the high-power electronic device and the high-frequency electronic device are each independently selected from the group consisting of a field effect transistor and a bipolar transistor.

17. The device according to claim 16, wherein The LED is selected from ultraviolet light LED and visible light LED, and the LD is selected from ultraviolet light LD and visible light LD.

18. A multi-layer structure, comprising:
two III-Nitride layers with different compositions; and
a buffer layer disposed between the two III-Nitride layers, wherein the buffer layer includes a non-polar III-Nitride material,
the non-polar III-Nitride material is obtained by a method including:
etching a non-polar III-Nitride template to form a plurality of nano-pillars, wherein the non-polar III-Nitride template is an m-plane or a-plane oriented single crystal having a formula of $X_xZ_{1-x}N$, where X and Z are independently selected from the group consisting of Ga, In and Al, and $0≤x≤1$, the plurality of nano-pillars are arranged along two different directions to form an ordered array of nano-pillars, the two different directions include a c-direction and an orthogonal direction with respect to the c-direction, wherein a cross-section of the nano-pillars is a circle, a cross-sectional size ranging from 20 nm to 2000 nm, and a pitch between centers of two nano-pillars ranging from 50 nm to 2000 nm, and the nano-pillars have a height ranging from 100 nm to 1000 nm;
growing a first III-Nitride on the ordered array of nano-pillars to make the ordered array of nano-pillars to grow into obtain an ordered array of nano-crystals, wherein a material of the first III-Nitride is the same as a material of the ordered array of nano-pillars; and growing a second III-Nitride on the ordered array of nano-crystals to form a coalesced non-polar III-Nitride layer, wherein a material of the second III-Nitride is different from the material of the first III-Nitride, or the non-polar III-Nitride material includes:

a plurality of nano-crystals; and a non-polar III-Nitride layer, wherein the plurality of nano-crystals is at least partially embedded in the non-polar III-Nitride layer, the non-polar III-Nitride layer is formed by growing a second III-Nitride on the plurality of nano-crystals, the plurality of nano-crystals is arranged along two different directions to form an ordered array of nano-crystals, the two different directions include a c-direction and an orthogonal direction with respect to the c-direction, wherein the ordered array of nano-crystals is formed by growing a first III-Nitride on an ordered array of nano-pillars, a cross-section of the nano-pillars is a circle, a cross-sectional size ranging from 20 nm to 2000 nm, and a pitch between centers of two nano-pillars ranging from 50 nm to 2000 nm, and the nano-pillars have a height ranging from 100 nm to 1000 nm, a material of the first III-Nitride is the same as a material of the ordered array of nano-pillars, and a material of the second III-Nitride is different from the material of the first III-Nitride, each of the non-polar III-Nitride layer and the plurality of nano-crystals is an m-plane or a-plane oriented single crystal material without polymorphism, each of the non-polar III-Nitride layer and the plurality of nano-crystals has a component selected from the group consisting of GaN, AlN, InN, $Al_xGa_{1-x}N$, $In_xGa_{1-x}N$ and $In_xAl_{1-x}N$, where $0<x<1$, and each of the non-polar III-Nitride layer and the plurality of nano-crystals independently has a formula of $X_xZ_{1-x}N$, where X and Z are independently selected from the group consisting of Ga, In and Al, and $0 \leq x \leq 1$.

* * * * *